June 3, 1969 D. R. VON RECKLINGHAUSEN 3,448,385
STEREOPHONIC RECEIVER SQUELCH APPARATUS
Filed June 28, 1965
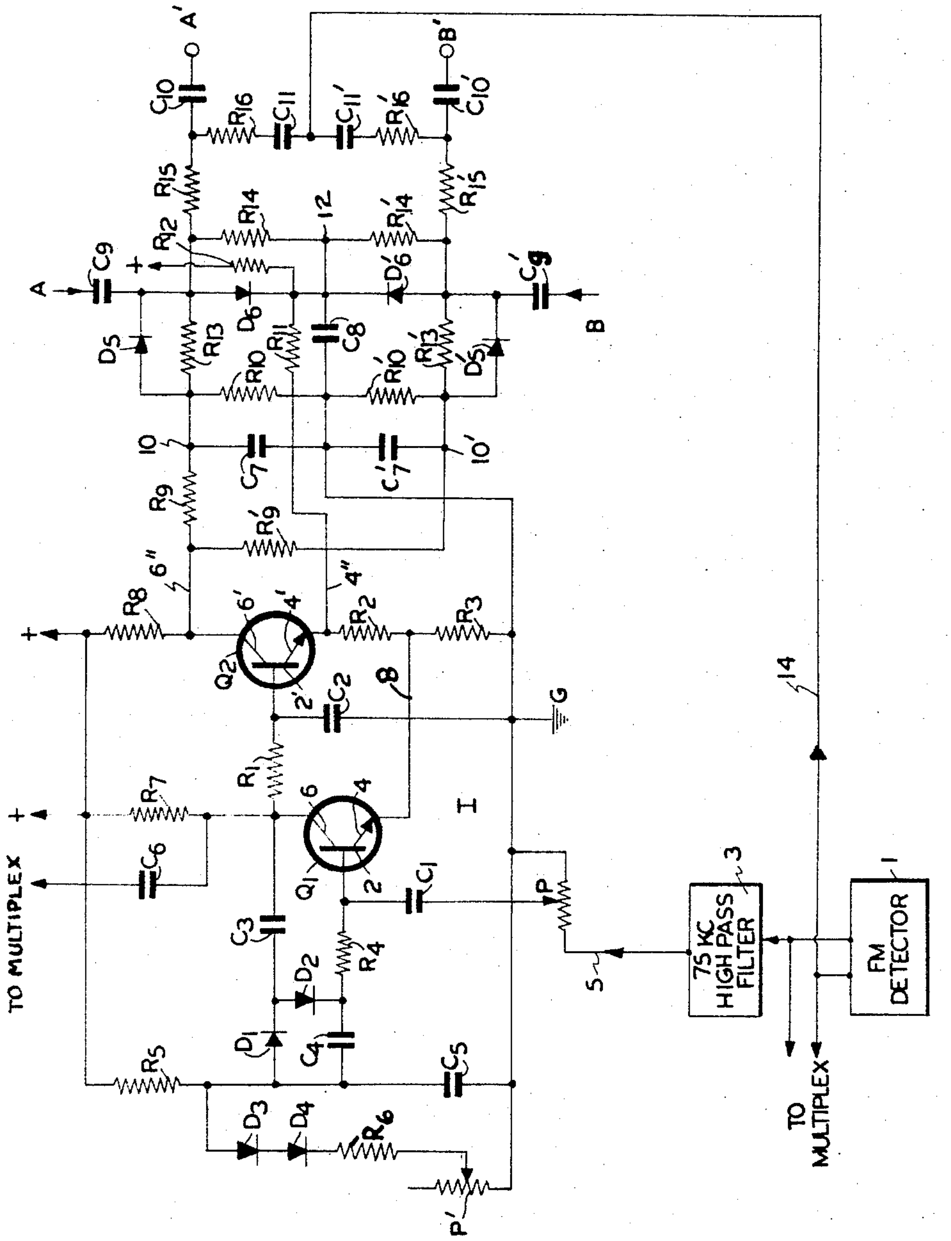
INVENTOR
DANIEL R. VonRECKLINGHAUSEN
BY Rines and Rines
ATTORNEYS United States Patent Office 3,448,385
Patented June 3, 1969

3,448,385
STEREOPHONIC RECEIVER SQUELCH APPARATUS

Daniel R. von Recklinghausen, Arlington, Mass., assignor to H. H. Scott, Inc., Maynard, Mass., a corporation of Massachusetts Filed June 28, 1965, Ser. No. 467,585
Int. Cl. H04b *1/12*
U.S. Cl. 325—348 5 Claims

ABSTRACT OF THE DISCLOSURE

A squelch circuit for an FM receiver which applies the noise output from the FM detector to a switching circuit responsive to a noise threshold for producing a bias voltage. A diode circuit responsive to said bias voltage is connected in a signal path for squelching the signal in the presence of noise.

The present invention relates to signal amplifier squelch apparatus and, more particularly, to squelch circuits adapted for use in stereophonic receivers, though the principles of the invention are equally applicable with other types of amplifier and receiving systems.

For many years, squelch circuits have been employed for silencing receivers in the absence of a desired received signal, as in vehicular communication receivers, for example, that are to be squelched when a call is not being received. In such fixed-tuned applications, the amplitude modulation of noise present ahead of the limiter-detector circuit has been used to control the effective shutting off of the receiver amplifier. Alternately, the automatic gain control voltage or automatic volume control voltage developed by either the amplitude-modulation detector or the automatic gain control detector circuit has been used as a means of squelch control. In such squelch systems, however, the amount of automatic gain control voltage for a given signal-to-noise ratio varies over the frequency band of operation. In addition, the amount of automatic gain control voltage will also vary with the gain of all of the stages of amplification ahead of the detector circuit, so that frequent readjustment of the squelch circuit has become a matter of necessity.

An object of the present invention, accordingly, is to provide a new and improved squelch circuit for receivers and the like that shall not be subject to the above disadvantages and limitations but that, on the contrary, is adapted for use over wide frequency bands and without significant adjustments.

A further object is to provide a novel squelch circuit of more general applicability, as well.

Still an additional object is to provide such a circuit that is particularly adapted for use in stereophonic receiving systems.

In summary, the squelch circuits of the present invention employ the noise output of the frequency modulation detector of, for example, a stereophonic signal receiving tuner, above 75 kilocycles (which, as is well known, is substantially one-half the FM receiver bandwidth), to effect squelching of the audio signal with the aid of novel diode switching circuits. Preferred constructional details are hereinafter set forth.

The invention will now be described with reference to the accompanying drawing, the single figure of which is a schematic circuit diagram illustrating a preferred embodiment of the invention illustratively shown as applied to a stereophonic receiving apparatus.

Referring to the drawing, the frequency modulation detector 1 is shown applying its output to conventional multiplex apparatus and to a 75-kilocycle high-pass filter 3, the noise output of which is fed at 5 through a variable attenuator P for adjusting the signal-to-noise ratio upon which squelching will occur, to a bistable trigger circuit I. The trigger circuit I comprises a pair of transistor stages $Q_1$ and $Q_2$ having respective base electrodes 2, 2', emitter electrodes 4, 4' and collector electrodes 6, 6'. The base 2 of transistor $Q_1$ receives the noise output of the detector 1 above 75 kilocycles (and those interference components above all modulation frequencies of concern) through coupling capacitor $C_1$. The collector 6 is connected through resistor $R_1$ to the base 2' of transistor $Q_2$ which is capacitively by-passed to ground G through capacitor $C_2$. The emitter 4' of transistor $Q_2$ is connected in a positive DC feedback path through emitter resistor $R_2$ and conductor 8 to the emitter 4 of the stage $Q_1$, the emitter resistor $R_3$ being common to both emitters 4 and 4' and with positive feedback voltage developed thereacross. In this circuit, $Q_1$ is always conducting and is capable of amplifying any alternating-current signals applied through capacitor $C_1$, while transistor $Q_2$ is either non-conducting or is in a fully saturated conducting state.

When a sufficient predetermined threshold of noise is present at the filter output at 5 (as when the receiver is tuned off channel) and is applied to the base 2 of transistor $Q_1$, the normally conducting transistor $Q_2$ will be rendered non-conductive. The time constant of the elements $R_1$ and $C_2$, which control the speed of switching between conduction and nonconduction of $Q_2$, is adjusted to be sufficiently fast for the purposes of squelching the ultimate received output in the absence of the desired signal, but slow enough so that spurious response to individual or isolated noise impulses will not effect the switching.

The amplified noise signal appearing at the collector 6 of $Q_1$ is also fed through capacitor $C_3$ to peak-to-peak detector comprising respective series and parallel-connected rectifying elements $D_1$ and $D_2$ and capacitor $C_4$, to apply through resistor $R_4$ a DC control voltage for the base 2 of $Q_1$. Operating bias is applied to the base 2 of $Q_1$, by means of resistor $R_4$ and diodes $D_2$ and $D_1$ in series, from a voltage divider consisting of resistor $R_5$, series-connected diodes $D_3$ and $D_4$, resistor $R_6$ and a variable resistor P', connected to ground G. The voltage drop across diodes $D_3$ and $D_4$ in series, varies in a substantially identical amount wtih the series voltage drop across diodes $D_1$ and $D_2$, thereby rendering this circuit substantially temperature insensitive. Adjustment of the control P' in effect sts the switching threshold (i.e. conduction or nonconduction of transistor $Q_2$) through its control of the effective base bias applied to the base 2 of transistor $Q_1$. P' is normally adjusted so that, in the absence of noise at 5, the transistor $Q_2$ is just beyond the point of switching to saturation conduction. Capacitor $C_5$ is essentially an AC grounding capacitor for the peak-to-peak detector $D_1$, $D_2$, $C_4$.

Resistor $R_7$ is connected between a positive supply terminal + and the collector 6 of the stage $Q_1$ so that there will appear developed across this resistor $R_7$ all of the AC and DC voltages appearing at the collector 6 of transistor $Q_1$. The output at collector 6 is also applied through coupling capacitor $C_6$ for further use in the conventional monophonic-to-stereophonic control circuit (not shown) of the multiplex system. Such systems are described, for example, in my copending application Ser. No. 376,035, filed June 18, 1964, entitled Monophonic-Stereophonic Automatic Switching Circuit. The collector 6' of stage $Q_2$ is provided with a collector load 8 connected to the said positive supply terminal +.

Resistor $R_8$ and resistors $R_2$ and $R_3$ are chosen such that when transistor $Q_2$ switches from conduction to nonconduction, substantially equal voltage changes (but of opposite sign) occur at the collector and emitter electrodes 6′ and 4′ of transistor $Q_2$. In this manner, the effective sum of the voltages along conductor 6″ and conductor 4″ leading respectively to the collector electrode 6′ and the emitter 4′ remain substantially constant irrespective of the state of operation of transistor $Q_2$. This serves to keep DC transient voltages at the output of the squelch circuit of the present invention to a very minimum.

It now remains to explain how the audio channel signals from the multiplex demodulator at A and B (in the particular illustrated stereophonic example) are effectively permitted to be applied to the subsequent amplifiers or other utilization circuits for these channels, shown at A′ and B′ or to be squelched when the FM detector is not tuned to the desired channel frequency. Two pairs of substantially symmetrical diode network circuits are provided, it being necessary only to describe the pair associated with the input A and the output A′, with the understanding that the network associated with the input B and the output B′ is similar and that the same circuit elements therein are given the same reference numerals as the network between A and A′ but with a prime notation. The network circuits involve later-described diodes $D_5$–$D_6$ and $D_5'$–$D_6'$, respectively associated with the squelching of the inputs from channels A and B. In this instance they operate somewhat independently though they could have been connected in parallel at the terminals 10 and 10′. The reason for the independent operation is that actual diodes obtainable from manufacturing sources vary in their forward resistance characteristics such that strict parallel connections would result in unequal operation of the two squelching circuits.

When transistor $Q_2$ is rendered conductive in the presence of noise at 5 below the desired level, thereby effectively connecting conductors 4″ and 6″ together, resistors $R_9$ and $R_{10}$ form a DC voltage divider, grounded at G, and resistors $R_{11}$ and $R_{12}$ form a second voltage divider connected to the positive supply terminal +. This results in applying reverse bias to diodes $D_5$ and $D_6$ respectively connected from the junction of resistors $R_9$, $R_{10}$ and $R_{13}$ to the opposite terminal of resistors $R_{13}$, and from that terminal to the point of connection of resistors $R_{11}$ and $R_{12}$. A substantially infinite dynamic resistance is presented by the reverse-biased diodes $D_5$ and $D_6$ such that the signal from A may pass through capacitor $C_9$, series resistor $R_{15}$ and coupling capacitor $C_{10}$ to the amplifier or other output A′. Since the reverse impedances of commercially available diodes also vary, relatively large resistors $R_{13}$ and $R_{14}$ are respectively shunted across diodes $D_5$ and $D_6$ so as to insure that substantially equal very high reverse impedance is presented by the diodes such that the DC voltage at the junction of diodes $D_5$ and $D_6$ is maintained at substantially one-half the supply voltage +.

When $Q_2$ is rendered non-conductive, current will flow through $R_8$, $R_9$ and the diodes $D_5$ and $D_6$ in direct-current series connection; $R_{11}$, $R_2$ and $R_3$ providing forward bias therefor and the diodes presenting a resulting low dynamic forward resistance. Since resistor $R_9$ and the corresponding resistor $R_9'$ associated with channel B are, in effect, connected in parallel (which parallel connection is made substantially equal in value to resistor $R_{11}$ and because of the previously described relationship between the values of resistor $R_8$ and resistors $R_2$ and $R_3$, the DC voltage of the junction of diodes $D_5$ and $D_6$ is again maintained at substantially one-half the positive supply voltage +.

A change in the state of the transistor $Q_2$ from conduction to non-conduction, therefore, results in a substantially imperceptible change in voltage appearing at the junction of diodes $D_5$ and $D_6$, this substantially constant voltage providing for substantially minimum audio transient output at the amplifier or other signal path output A′ as a result of the switching. When the diodes $D_5$ and $D_6$ are thus forward-biased, presenting their low dynamic resistance, they are effectively connected in shunt with the signal from A and thus squelch the signal that would otherwise be fed from A along the signal path to the output A′.

While excellent shunting is effected in this manner, the squelching is not, of course, absolutely complete. Through proper selection of the values of the internal impedance of the multiplex detector at A in series with capacitor $C_9$ and the dynamic resistance of the diodes $D_5$ and $D_6$, effectively in parallel with capacitors $C_7$ and $C_8$, the signal entering at A may be further attenuated during the required squelching, somewhat of the order of 50 decibels or so. This attenuation may be further improved by the second attenuator formed by resistors $R_{15}$ and $R_{16}$ and a bucking or opposite-polarity signal voltage obtained from the output of the FM detector 1, fed along conductor 14 through capacitor $C_{11}$ to resistor $R_{16}$. An out-of-phase audio signal is thus produced for bucking against the current produced at $R_{15}$ and $R_{16}$, further to attenuate the signal and improve the degree of squelching. The circuit is further adjusted so that a lower signal-to-noise ratio is required to squelch than to permit the unsquelched signal to be used. Advantage is taken of the fact, moreover, that noise on each side of the station (as a result of beating between noise and carrier) is larger than the noise amplitude at the center frequency of the desired signal, and is also larger than the noise produced when the receiver is tuned away from any signal. Advantage is taken, furthermore, of the fact that two adjacent channel signals produce a beat frequency lying most generally above the cutoff frequency of the 75-kilocycle high-pass filter 3, which this squelch circuit recognizes in the same manner as noise. All this permits rapid squelching when tuning off the signal, and also permits squelching when tuning between two signals, even though such two signals may be located on adjacent channels (customarily assigned 200 kilocycles apart).

Further modifications will occur to those skilled in the art and all such are considered to fall within the spirit and scope of the invention as defined in the appended claims.

What is claimed is:

1. Receiver squelch apparatus having, in combination, signal-receiving means comprising frequency-modulation detecting apparatus, high-pass filter means connected with the detecting aparatus to produce a noise-containing output of frequency components higher than those of the modulation frequencies and thus higher than substantially one-half the bandwidth of the said receiving means when the receiving means is tuned off channel, switching circuit means responsive to a predetermined threshold of the said noise-containing output for producing a different predetermined bias voltage than in the absence of said output, means connected with the said switching circuit means and adapted to present relatively low and high impedances depending upon which of the said bias voltages is produced, signal path means, and means for interposing the high and low-impedance-presenting means in the said signal path means to squelch signal therein in the presence of said noise-containing output and to permit the passage of signal in the absence thereof, said signal path means comprising a pair of stereophonic signal channels, said high and low-impedance-presenting means comprising a pair of similar diode-containing networks, the said different bias voltage being a diode reverse-bias voltage, said switching circuit means including a pair of transistors comprising a bistable circuit, one of said transistors being always conductve and the other transistor being conductive in the absence of said predetermined threshold of noise-containing output and being rendered nonconductive by the said one transistor in the presence of said predetermined threshold of noise-containing output, said apparatus further comprising voltage divider means provided between said other transistor and diode means of the said diode-containing networks for rendering the voltage at the region of the diode means in the said signal path of substantially constant voltage value irrespective of the conduction or nonconduction of the said other transistor, thereby to obviate switching transients in the output of the said signal path means.

2. Receiver squelch apparatus having, in combination, signal-receiving means comprising frequency-modulation detecting apparatus, high-pass filter means connected with the detecting apparatus to produce a noise-containing output of frequency components higher than those of the modulation frequencies and thus higher than substantially one-half the bandwidth of the said receiving means when the receiving means is tuned off channel, switching circuit means responsive to a predetermined threshold of the said noise-containing output for producing a different predetermined bias voltage than in the absence of said output, means connected with the said switching circuit means and adapted to present relatively low and high impedances depending upon which of the said bias voltages is produced, signal path means, and means for interposing the high and low impedance-presenting means in the said signal path means to squelch signal therein in the presence of said noise-containing output and to permit the passage of signal in the absence thereof, said signal path means comprising a pair of stereophonic signal channels, said high and low-impedance-presenting means comprising a pair of similar diode-containing networks, the said different bias voltage being a diode reverse-bias voltage, said switching circuit means including a pair of transistors comprising a bistable circuit, one of said transistors being always conductive and the other transistor being conductive in the absence of said predetermined threshold of noise-containing output and being rendered non-conductive by the said one transistor in the presence of said predetermined threshold of noise-containing output, said signal path means being provided with attenuator network means connected with an out-of-phase output of the said detecting apparatus to provide a bucking current for residual signal not suppressed by diode means of the said diode-containing networks in the said signal path means.

3. Receiver squelch apparatus having, in combination, signal-receiving means comprising frequency-modulation detecting apparatus, high-pass filter means connected with the detecting apparatus to produce a noise-containing output of frequency components higher than those of the modulation frequencies and thus higher than substantially one-half the bandwidth of the said receiving means when the receiving means is tuned off channel, switching circuit means responsive to a predetermined threshold of the said noise-containing output for producing a different predetermined bias voltage than in the absence of said output, means connected with the said switching circuit means and adapted to present relatively low and high impedances depending upon which of the said bias voltages is produced, signal path means, and means for interposing the high and low impedance-presenting means in the said signal path means to squelch signal therein in the presence of said noise-containing output and to permit the passage of signal in the absence thereof, the said high and low-impedance-presenting means comprising a diode-containing network, the said different bias voltage being a diode reverse-bias voltage, said switching circuit means including a pair of transistors comprising a bistable circuit, one of said transistors being always conductive and the other transistor being conductive in the absence of said predetermined threshold of noise-containing output and being rendered nonconductive by the said one transistor in the presence of said predetermined threshold of noise-containing output, said apparatus further comprising voltage divider means provided between said other transistor and diode means of the said diode-containing network for rendering the voltage at the region of the diode means in the said signal path of substantially constant voltage value irrespective of the conduction or nonconduction of the said other transistor, thereby to obviate switching transients in the output of the said signal path means.

4. Receiver squelch apparatus having, in combination, signal-receiving means comprising frequency-modulation detecting apparatus, high-pass filter means connected with the detecting apparatus to produce a noise-containing output of frequency components higher than those of the modulation frequencies and thus higher than substantially one-half the bandwidth of the said receiving means when the receiving means is tuned off channel, switching circuit means responsive to a predetermined threshold of the said noise-containing output for producing a different predetermined bias voltage than in the absence of said output, means connected with the said switching circuit means and adapted to present relatively low and high impedances depending upon which of the said bias voltages is produced, signal path means, and means for interposing the high and low impedance-presenting means in the said signal path means to squelch signal therein in the presence of said noise-containing output and to permit the passage of signal in the absence thereof, the said high and low impedance-presenting means comprising a diode-containing network, the said different bias voltage being a diode reverse-bias voltage, the said signal path means being provided with attenuator network means connected with an out-of-phase output of the said detecting apparatus to provide a bucking current for residual signal not suppressed by diode means of the said diode-containing network in the said signal path.

5. Receiver squelch apparatus in accordance with claim 3, and wherein time-constant means is provided interconnecting the said one and the said other transistor and of value sufficiently fast to enable rapid squelch in the presence of the said noise-containing output but sufficiently slow to prevent spurious switching operation in response to isolated noise output impulses, said one transistor having a peak-to-peak diode detector circuit interconnected between an output terminal and an input terminal of said one transistor.

References Cited

UNITED STATES PATENTS

| | | | |
|---|---|---|---|
| 2,602,885 | 7/1952 | Armstrong | 325—348 |
| 3,140,446 | 7/1964 | Myers et al. | 325—478 |
| 3,188,571 | 6/1965 | Michael | 325—348 XR |

KATHLEEN H. CLAFFY, *Primary Examiner.*

R. S. BELL, *Assistant Examiner.*

U.S. Cl. X.R.

325—478